(12) United States Patent
Liu et al.

(10) Patent No.: US 11,444,163 B2
(45) Date of Patent: Sep. 13, 2022

(54) CHANNEL STRUCTURE HAVING TUNNELING LAYER WITH ADJUSTED NITROGEN WEIGHT PERCENT AND METHODS FOR FORMING THE SAME

(71) Applicant: YANGTZE MEMORY TECHNOLOGIES CO., LTD., Wuhan (CN)

(72) Inventors: Song Liu, Wuhan (CN); Chao Shen, Wuhan (CN); Dejian Chen, Wuhan (CN); Wenting Wang, Wuhan (CN); Xinxin Huang, Wuhan (CN); Zhiping Xu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/860,971

(22) Filed: Apr. 28, 2020

(65) Prior Publication Data
US 2021/0217856 A1 Jul. 15, 2021

Related U.S. Application Data

(63) Continuation of application No. PCT/CN2020/071896, filed on Jan. 14, 2020.

(51) Int. Cl.
*H01L 27/11582* (2017.01)
*H01L 21/28* (2006.01)
(Continued)

(52) U.S. Cl.
CPC .... *H01L 29/40117* (2019.08); *H01L 21/0214* (2013.01); *H01L 21/0228* (2013.01);
(Continued)

(58) Field of Classification Search
CPC ......... H01L 27/11582; H01L 29/40114; H01L 29/40117; H01L 21/02164; H01L 21/0223;
(Continued)

(56) References Cited

U.S. PATENT DOCUMENTS 6,969,886 B1 11/2005 Park et al.
6,991,987 B1 1/2006 Guo et al.
(Continued)

FOREIGN PATENT DOCUMENTS

CN 102668045 A 9/2012
CN 103069552 A 4/2013
(Continued)

OTHER PUBLICATIONS

Y. T. Kim et al., "Influence of hydrogen on SiON thick film for silica waveguide deposited by PECVD and annealing effect," Surface and Coatings Technology, vol. 174-175, pp. 204-207, Sep.-Oct. 2003.
(Continued)

*Primary Examiner* — Mohammad M Choudhry
(74) *Attorney, Agent, or Firm* — Bayes PLLC

(57) ABSTRACT

Embodiments of memory devices and fabrication methods thereof are disclosed. In an example, a memory device includes a substrate, a memory stack, and a channel structure. The memory stack includes interleaved conductor layers and dielectric layers over the substrate. The channel structure extends through the memory stack into the substrate and includes a functional layer that includes a tunneling layer of which a nitrogen weight percent is not greater than about 28%.

20 Claims, 8 Drawing Sheets

(51) Int. Cl.
*H01L 21/02* (2006.01)
*H01L 21/3105* (2006.01)
*H01L 27/1157* (2017.01)
*H01L 29/423* (2006.01)
*H01L 29/51* (2006.01)

(52) U.S. Cl.
CPC ...... *H01L 21/3105* (2013.01); *H01L 27/1157* (2013.01); *H01L 27/11582* (2013.01); *H01L 29/4234* (2013.01); *H01L 29/518* (2013.01)

(58) Field of Classification Search
CPC ......... H01L 21/02255; H01L 21/31111; H01L 27/11524; H01L 27/11556; H01L 27/1157; H01L 29/42324; H01L 29/4234
See application file for complete search history.

(56) References Cited

U.S. PATENT DOCUMENTS

| | | | |
|---|---|---|---|
| 8,169,835 | B2 | 5/2012 | Liao et al. |
| 9,287,290 | B1 | 3/2016 | Rabkin et al. |
| 9,449,985 | B1 | 9/2016 | Rabkin et al. |
| 2002/0089012 | A1* | 7/2002 | Nomoto ................ H01L 27/12 257/316 |
| 2003/0235962 | A1* | 12/2003 | Ishikawa ............... H01L 29/513 438/287 |
| 2007/0167030 | A1* | 7/2007 | Jee .................... H01L 21/02238 438/769 |
| 2008/0121962 | A1* | 5/2008 | Forbes .............. H01L 21/02178 257/310 |
| 2008/0173930 | A1 | 7/2008 | Watanabe et al. |
| 2009/0243001 | A1 | 10/2009 | Ramkumar et al. |
| 2010/0102376 | A1 | 4/2010 | Ma et al. |
| 2016/0043179 | A1 | 2/2016 | Noh et al. |
| 2017/0110470 | A1* | 4/2017 | Rabkin ............. H01L 27/11582 |
| 2019/0067323 | A1 | 2/2019 | Xu et al. |

FOREIGN PATENT DOCUMENTS

| | | |
|---|---|---|
| CN | 105226027 A | 1/2016 |
| CN | 105981158 A | 9/2016 |
| CN | 107658302 A | 2/2018 |
| CN | 107731849 A | 2/2018 |
| CN | 108305877 A | 7/2018 |
| CN | 108987408 A | 12/2018 |
| CN | 109300900 A | 2/2019 |
| CN | 110010617 A | 7/2019 |
| CN | 110121774 A | 8/2019 |
| CN | 110596157 A | 12/2019 |
| TW | 201836128 A | 10/2018 |
| TW | 201947326 A | 12/2019 |

OTHER PUBLICATIONS

International Search Report issued in corresponding International Application No. PCT/CN2020/071896, dated Sep. 8, 2020, 4 pages.

* cited by examiner

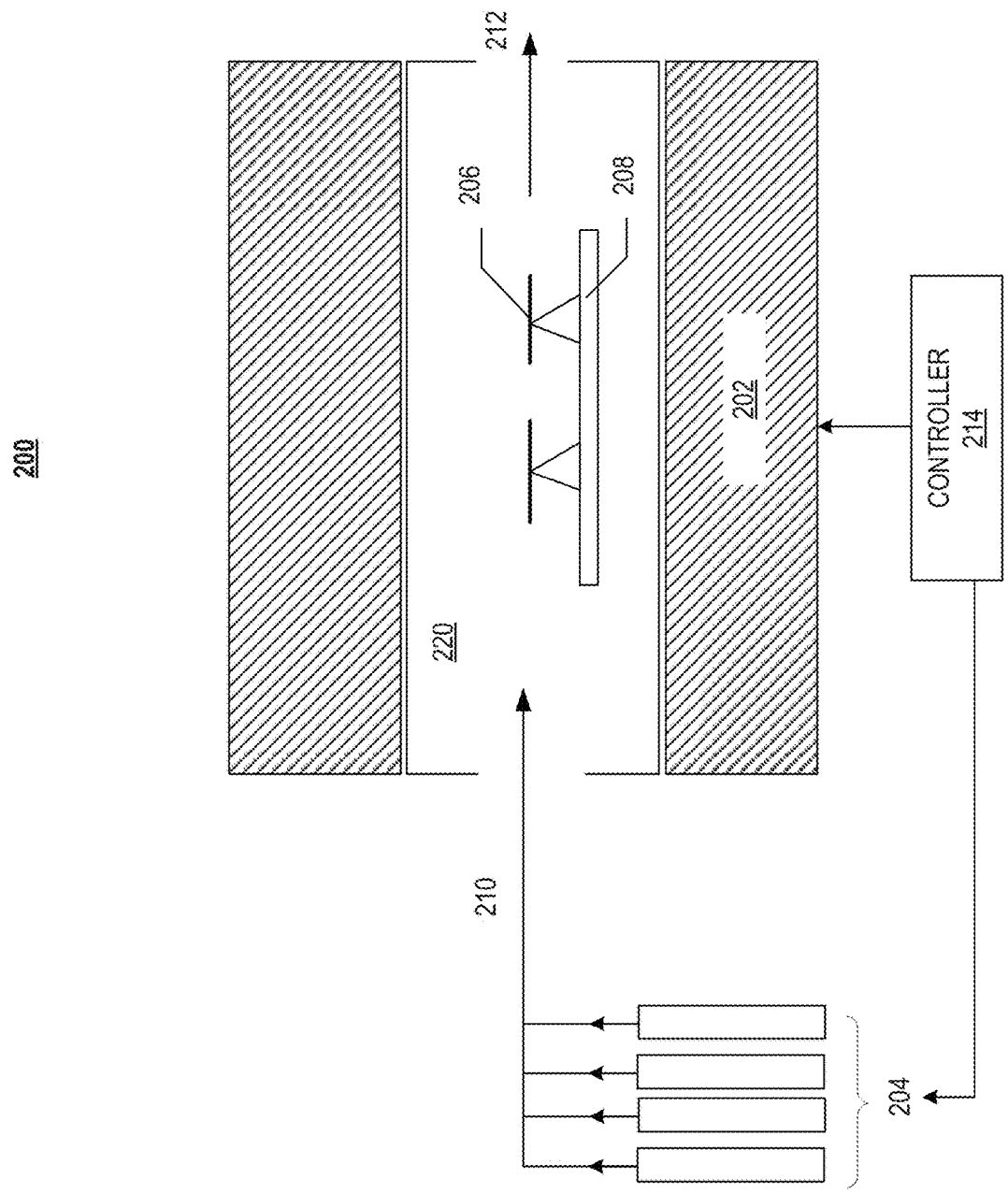

300

300

CHANNEL STRUCTURE HAVING TUNNELING LAYER WITH ADJUSTED NITROGEN WEIGHT PERCENT AND METHODS FOR FORMING THE SAME

CROSS-REFERENCE TO RELATED APPLICATIONS

This application is continuation of International Application No. PCT/CN2020/071896, filed on Jan. 14, 2020, entitled "CHANNEL STRUCTURE HAVING TUNNELING LAYER WITH ADJUSTED NITROGEN WEIGHT PERCENT AND METHODS FOR FORMING THE SAME," which is hereby incorporated by reference in its entirety.

BACKGROUND

Embodiments of the present disclosure relate to three-dimensional (3D) memory devices and weight percent and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral devices for controlling signals to and from the memory array.

SUMMARY

Embodiments of channel structures having a tunneling layer with an adjusted nitrogen weight percent and fabrication methods thereof are disclosed herein.

In one example, a memory device includes a substrate, a memory stack, and a channel structure. The memory stack includes interleaved conductor layers and dielectric layers over the substrate. The channel structure extends through the memory stack into the substrate and includes a functional layer that has a tunneling layer of which a nitrogen weight percent is not greater than about 28%.

In another example, a method for forming a memory device includes the following operations. First, a channel hole is formed in a stack structure over a substrate. A blocking layer, a memory layer, and a tunneling layer are sequentially deposited to arrange radially from a sidewall of the channel hole towards a center of the channel hole. A thermal treatment is performed to adjust a nitrogen weight content in the tunneling layer to be no greater than about 28%. A semiconductor layer is deposited over the tunneling layer in the channel hole.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 2 illustrates an annealing apparatus used in various embodiments of the present disclosure.

Figure 1:
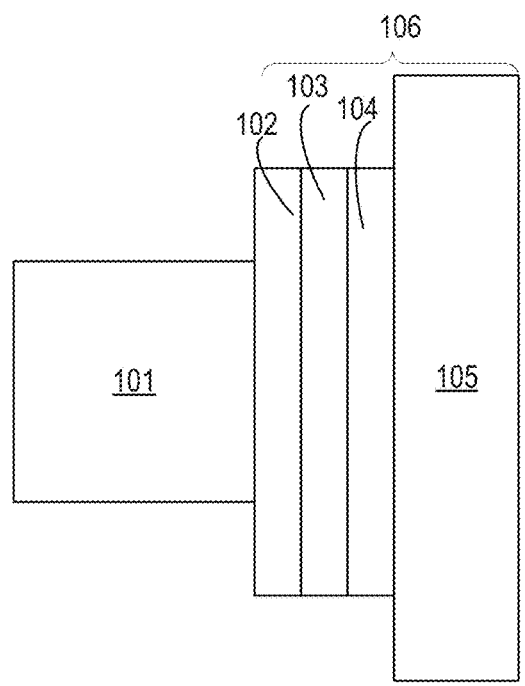
FIG. 1 illustrates a schematic view of a cross-section of a portion of a channel structure in a 3D memory device, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "(3D NAND memory string" refers to a vertically-oriented string of memory cell transistors connected in series on a laterally-oriented substrate so that the string of memory cell transistors extends in the vertical direction with respect to the substrate. As used herein, the term "vertical/vertically" means nominally perpendicular to the lateral surface of a substrate.

As used herein, the terms "stair," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stair" refers to a vertical shift in the height of a set of adjoined surfaces.

In 3D memory devices, memory cells are formed at the intersections of gate electrodes and 3D NAND memory strings. A 3D NAND memory string often includes a channel structure that has a blocking layer, a storage layer, a tunneling layer, and a semiconductor layer arranged radially from a sidewall of the channel structure to a center of the channel structure.

The tunneling layer often includes dielectric materials such as silicon oxynitride ($SiO_xN_y$, referred to herein as "SiON" as well), which provides/determines the nitrogen weight percent (wt %, as known as "mass percent") in the tunneling layer. The nitrogen weight percent can be critical to the electrical properties and film quality of the tunneling layer. It is thus important to form a tunneling layer of high film quality and of desired nitrogen weight percent. In conventional device fabrication, the tunneling layer is formed by deposition without any post-deposition treatment, and the tuning of nitrogen weight percent in the tunneling layer can be limited, e.g., typically in a range of about 28% to about 40%. Defects in the tunneling layer can remain unrepaired. In other words, it can be difficult to adjust the nitrogen weight percent in the tunneling layer and obtain desired film quality at the same time. That is, the process window for controlling the nitrogen weight percent in the tunneling layer is relatively small.

Various embodiments in accordance with the present disclosure provide a 3D memory device having a channel structure with a tunneling layer of reduced nitrogen weight percent. The range of the nitrogen weight percent in the disclosed tunneling layer may be lower than that in a conventionally-formed tunneling layer such that the disclosed method can be used to increase the range of nitrogen weight percent in a tunneling layer so that the tuning of nitrogen weight percent in the tunneling layer can be easier. That is the process window for controlling the nitrogen weight percent in the tunneling layer can be enlarged, in particular in the lower end. According to the embodiments, to form the tunneling layer, an annealing process is performed before the deposition of the semiconductor layer to decrease the nitrogen weight percent in the tunneling layer and improve the film quality of the tunneling layer. Various parameters of the annealing process can be controlled and adjusted to produce the tunneling layer of a desired nitrogen weight percent.

To form a desired atmosphere for the annealing process, in some embodiments, oxygen gas is introduced into the reactor chamber; and in some embodiments, a mixture of oxygen gas and hydrogen chloride gas is introduced into the reactor chamber. The flow rate of oxygen gas can be higher than the flow rate of hydrogen chloride gas. The annealing time period can be controlled to be in a range of about 30 minutes to about 120 minutes. The annealing temperature can be controlled to be in a range of about 800 degrees Celsius to about 950 degrees Celsius. The resulting tunneling layer can have a nitrogen weight percent of about 10% to about 28%, lower than the nitrogen weight percent in conventionally-formed tunneling layer. Meanwhile, the annealing process can reduce the number of defects in the tunneling layer and/or allow the distribution of nitrogen atoms to be more uniform, improving the film quality of the tunneling layer.

FIG. 1 illustrates a cross-section view of a portion of a channel structure 100, according to some embodiments. Channel structure 100 may be part of a 3D NAND memory string extending in a memory stack that includes a plurality of interleaved conductor layers and dielectric layers. The conductor layers function as the gate electrodes (e.g., 101) of the memory strings. As shown in FIG. 1, a gate electrode 101 forms contact with a channel structure. For viewing simplicity, a portion of the channel structure is depicted, shown as element 106, which includes a blocking layer 102, a storage layer 103, a tunneling layer 104, and a semiconductor layer 105 (e.g., in which a semiconductor channel is formed), arranged sequentially along the x-axis (e.g., horizontally) or a direction substantially perpendicular to the direction along which semiconductor layer 105 extends. In some embodiments, element 106 further includes a dielectric core (not shown), where semiconductor layer 105 is positioned between tunneling layer 104 and the dielectric core. Blocking layer 102, storage layer 103, tunneling layer 104, and semiconductor layer 105 may extend along the z-axis (e.g., vertically). Gate electrode 101 can include any suitable conductor materials such as tungsten (W), cobalt (Co), aluminum (Al), copper (Cu), silicides, and/or doped polysilicon.

Each one of blocking layer 102, memory layer 103, and tunneling layer 104 can include a single-layered structure or a multiple-layered structure. Blocking layer 102 reduces or prevents charges from escaping into gate electrodes 101, and storage layer 103 traps the charges. Tunneling layer 104 facilitates the charge tunneling under a suitable bias. Semiconductor layer 105, in which a semiconductor channel is formed, facilitates the transport of charges vertically in the channel structure. Tunneling layer 104 can affect the electrical properties of the memory cells such as the program/erase speed, the leakage current, endurance, and retention of data.

In some embodiments, blocking layer 102 includes a dielectric material, e.g., a dielectric metal oxide. For example, the first blocking layer can include a dielectric metal oxide having a sufficiently high dielectric constant (e.g., greater than 7.9). Examples of the first blocking layer include aluminum oxide, hafnium oxide, lanthanum oxide, yttrium oxide, tantalum oxide, silicates thereof, nitrogen-doped compounds thereof, and/or alloys thereof. Blocking layer 102 can include a dielectric material that is different from the aforementioned dielectric material. For example, blocking layer 102 can include silicon oxide, silicon oxynitride, and/or silicon nitride.

Storage layer 103 can be a charge-trapping layer formed over blocking layer 102. In some embodiments, storage layer 103 includes one or more insulating materials such as silicon nitride and/or silicon oxynitride SiON.

Tunneling layer 104 can include a dielectric material over storage layer 103. Tunneling layer 104 can include a silicon oxide layer, one or more silicon oxynitride layers, dielectric metal oxides, dielectric metal oxynitride, dielectric metal silicates, and/or alloys thereof. In some embodiments, tunneling layer 104 includes a plurality of silicon oxynitride layers and a silicon oxide layer, wherein the silicon oxide layer is positioned between the plurality of silicon oxynitride layers and memory layer 103. In some embodiments, a thickness of tunneling layer 104 is in a range of about 5 nm to about 20 nm, such as between 5 nm and 20 nm (e.g., 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, any range bounded by the lower end by any of these values, or in any range defined by any two of these values).

A nitrogen weight percent (e.g., N wt %) of tunneling layer 104 may be no greater than about 28%. In some embodiments, the nitrogen weight percent is in a range of about 10% to about 28%, such as between 10% and 28% (e.g., 10%, 11%, 12%, 13%, 14%, 15%, 16%, 16%, 18%, 19%, 20%, 21%, 22%, 23%, 24%, 25%, 26%, 27%, 28%, any range bounded by the lower end by any of these values, or in any range defined by any two of these values). For example, the nitrogen weight percent may be between 10% and 28%, e.g., between about 10% and about 20%, between about 12% and about 28%, between about 12% and about 20%, between about 14% and about 20%, between about 12% and about 18%, between about 14% and about 18%, and between about 16% and about 18%. In some embodiments, the nitrogen weight percent may be about 10%, 12%, 15%, 16.5% 18%, 20%, 21.5%, 23%, 25%, 26.5%, and 28%. In some embodiments, the nitrogen weight percent may be no greater than about 20%, such as between 10% and 20% (e.g., 10%, 11%, 12%, 13%, 14%, 15%, 16%, 16%, 18%, 19%, 20%, any range bounded by the lower end by any of these values, or in any range defined by any two of these values). For example, the nitrogen weight percent may be between 10% and 20%, e.g., between about 10% and about 18%, between about 12% and about 18%, between about 12% and about 16%, and between about 14% and about 16%. In some embodiments, the nitrogen weight percent may be about 10%, 12%, 15%, 16.5% 18%, and 20%. Compared with the tunneling layer made by traditional processes that does not involve an annealing process disclosed herein, the nitrogen weight percent of tunneling layer 104 can be reduced/adjusted.

In some embodiments, the oxygen weight percent of tunneling layer 104 may be adjusted to such as no less than about 32%. In some embodiments, the oxygen weight percent is in a range of about 32% to about 46%, such as between 32% and 46% (e.g., 32%, 33%, 34%, 35%, 36%, 37%, 38%, 39%, 40%, 41%, 42%, 43%, 44%, 45%, 46%, any range bounded by the lower end by any of these values, or in any range defined by any two of these values). For example, the oxygen weight percent may be between about 32% and 46%, e.g., between about 32% and about 44%, between about 34% and about 46%, between about 34% and about 44%, between about 36% and about 44%, between about 36% and about 42%, between about 38% and about 42%, and between about 36% and about 40%. In some embodiments, the oxygen weight percent may be about 32%, 34%, 35.5%, 37%, 39.5%, 41%, 42.5%, and 43%.

Semiconductor layer 105 can include one or more semiconductor materials such as a one-element semiconductor material, an III-V compound semiconductor material, an II-VI compound semiconductor material, and/or an organic semiconductor material. In some embodiments, semiconductor layer 105 includes a polysilicon layer. In some embodiments, element 106 further includes a dielectric core over semiconductor layer 105. The dielectric core can include a suitable dielectric material and can completely or partially fill up (without or with an air gap) the remaining space (in channel structure 100) surrounded by semiconductor layer 105. In some embodiments, the dielectric core includes SiO, e.g., SiO of sufficiently high purity.

Figure 3A:
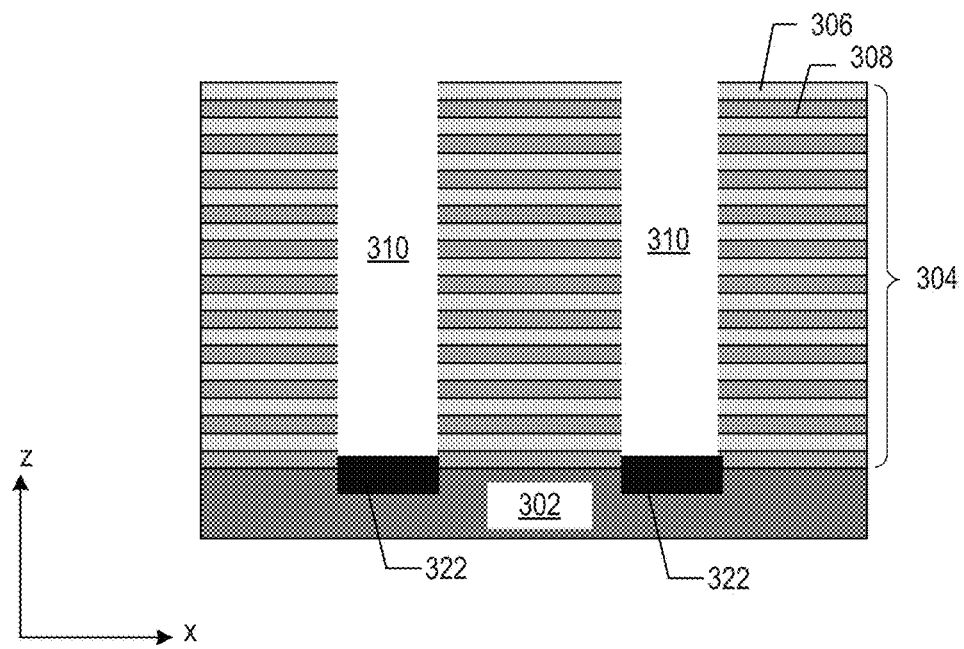
FIGS. 3A-3D illustrate an exemplary fabrication process to form a channel structure having a tunneling layer with reduced nitrogen weight percent, according to some embodiments.
Figure 3B:
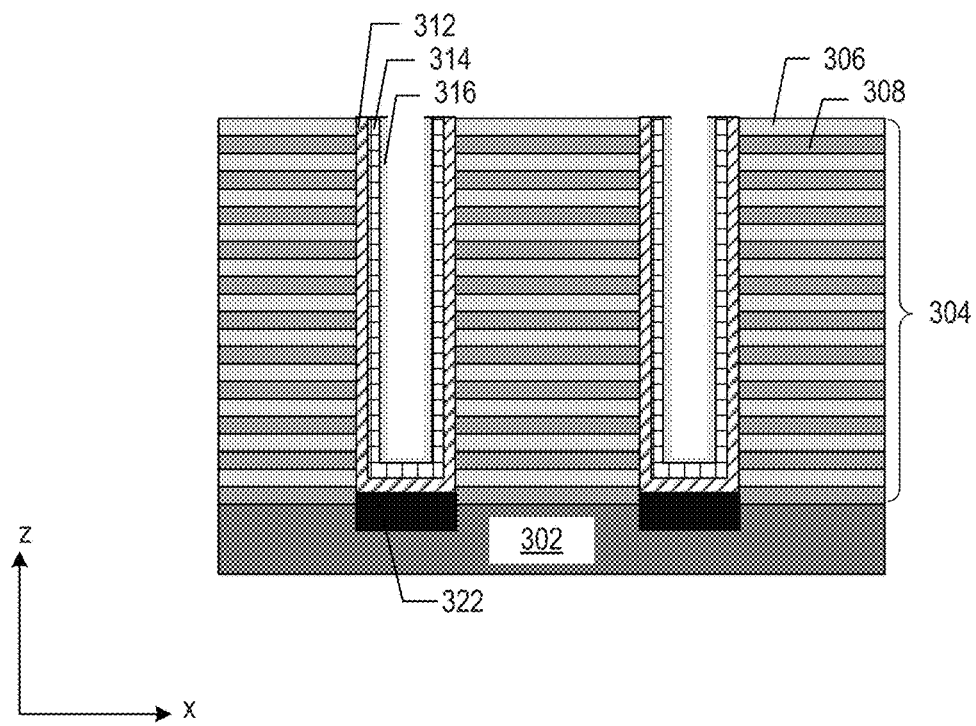
Figure 3C:
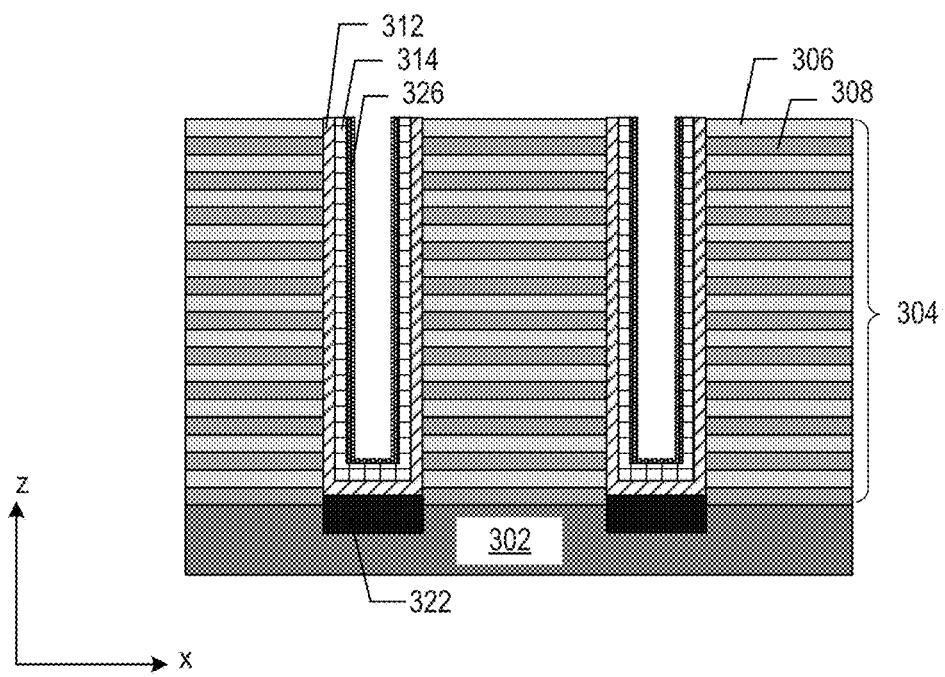
Figure 3D:
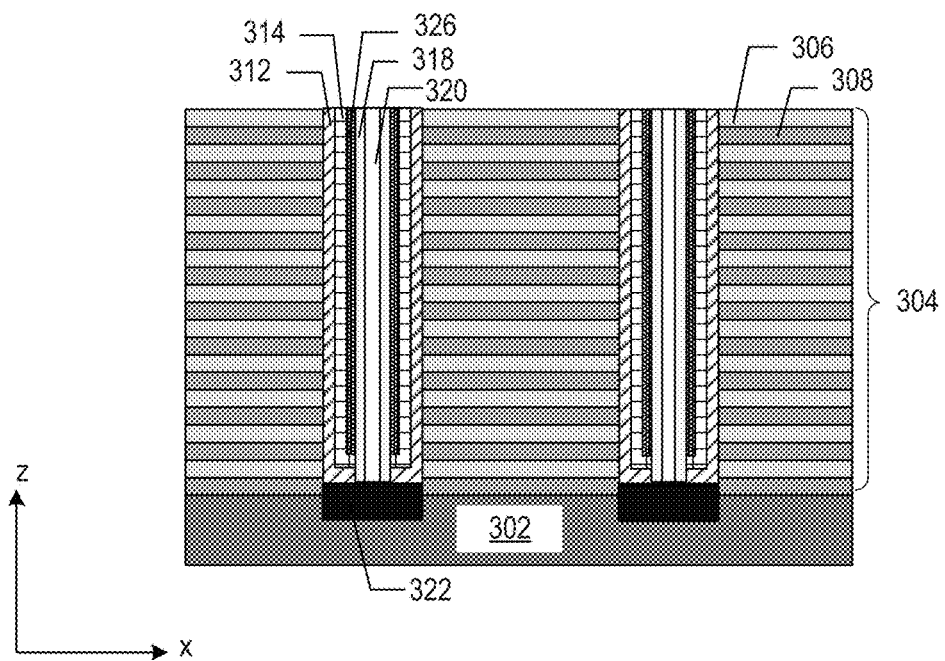
Figure 4:
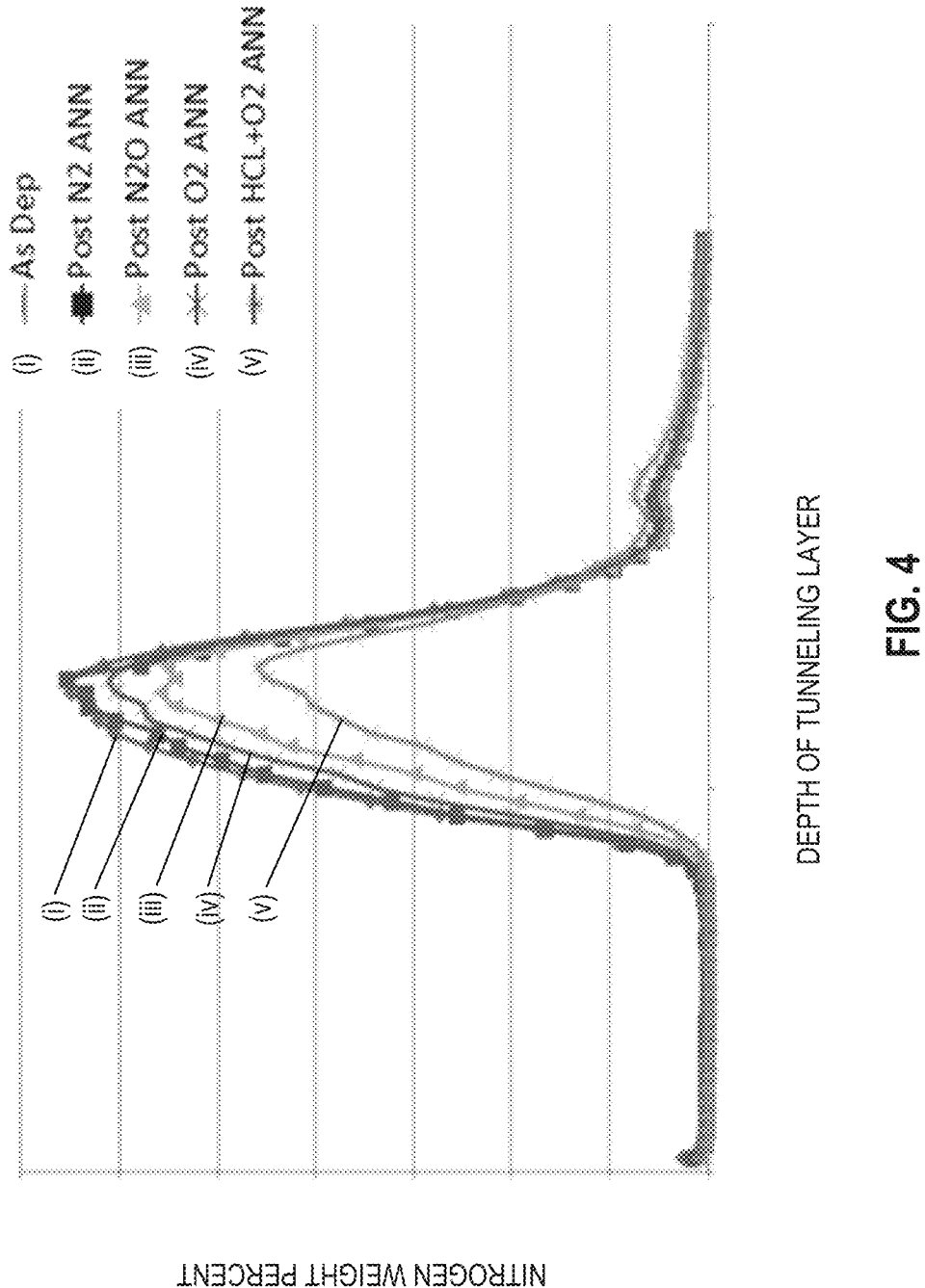
FIG. 4 illustrates nitrogen weight percents formed under different annealing conditions, according to some embodiments.
Figure 5:
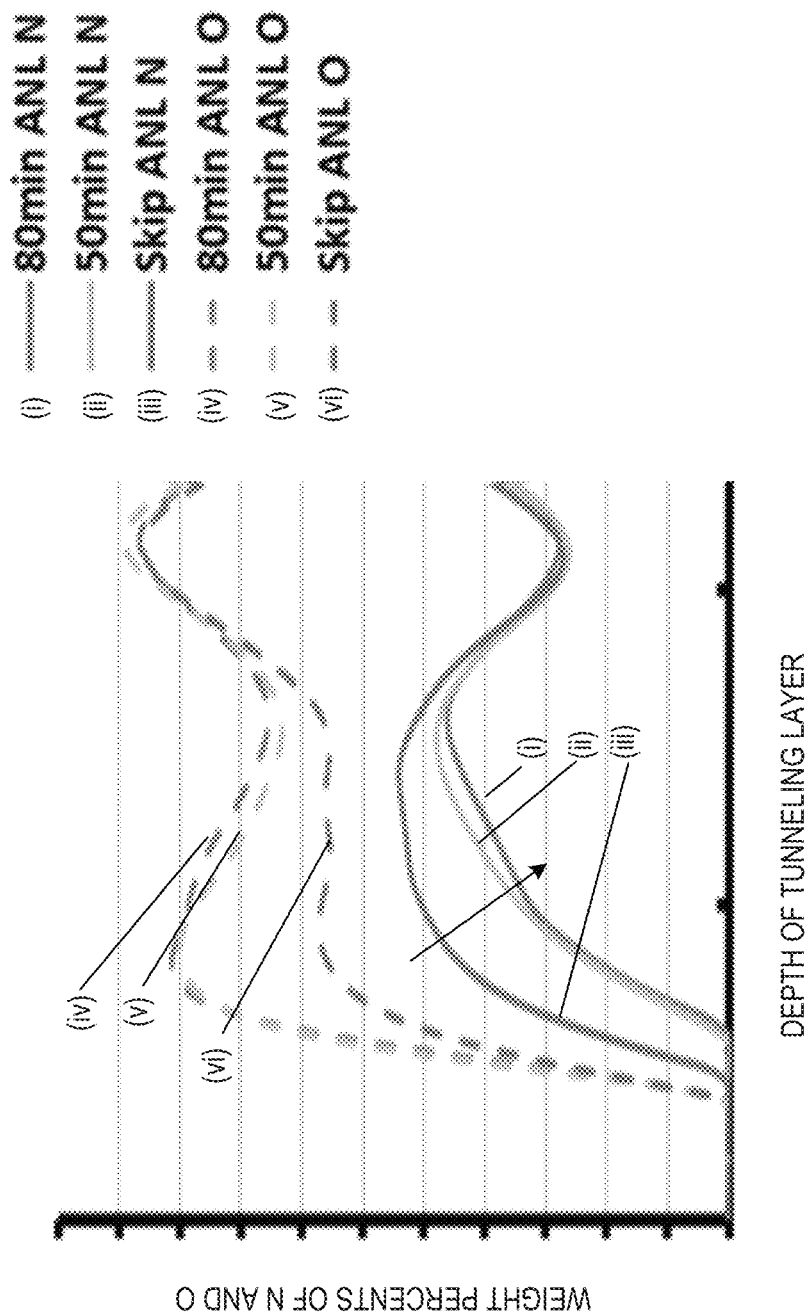
FIG. 5 illustrates nitrogen weight percents and oxygen weight percents formed under different annealing conditions, according to some embodiments.
Figure 6:
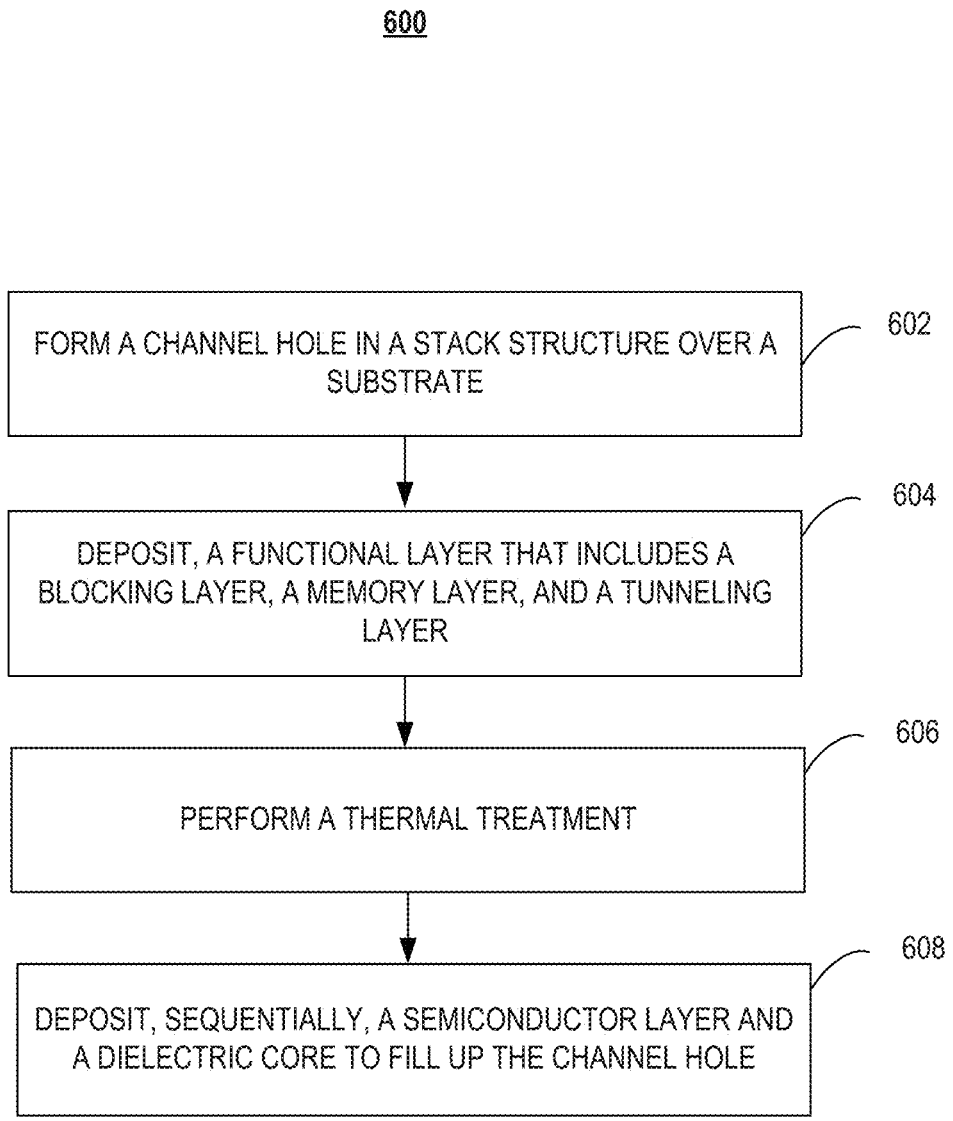
FIG. 6 illustrates a flowchart of an exemplary fabrication process to form a channel structure having an exemplary tunneling layer with a reduced nitrogen weight percent, according to some embodiments.

FIG. 2 illustrates a diagram of an annealing apparatus 200 used in an annealing process that forms channel structure 100, according to some embodiments. Specifically, annealing apparatus 200 can be used to form tunneling layer 104 in a 3D memory device before semiconductor layer 105 is deposited. FIGS. 3A-3D illustrates an exemplary fabrication method 300 to form a channel structure, e.g., similar to channel structure 100, according to some embodiments. FIG. 6 illustrates a flowchart 600 of method 300, according to some embodiments. FIGS. 4 and 5 illustrate variation trends of nitrogen weight percent and oxygen weight percent under various annealing conditions. For ease of illustration, FIGS. 2-6 are illustrated together. It is understood that the operations shown in method 300 are not exhaustive and that other operations can be performed as well before, after, or between any of the illustrated operations. Further, some of the operations may be performed simultaneously, or in a different order than shown in FIGS. 3 and 6. In some embodiments, method 300 is employed to form channel structure 100 in FIG. 1.

Referring to FIG. 6, method 300 starts at operation 602, in which a channel hole is formed in a stack structure over a substrate. FIG. 3A illustrates a corresponding structure.

As shown in FIG. 3A, one or more channel holes 310 are formed extending in a stack structure 304 above a substrate 302. Stack structure 304 may be a dielectric stack that includes interleaved a plurality of sacrificial layers 306 and a plurality of dielectric layers 308. Substrate 302 can include silicon (e.g., single crystalline silicon, c-Si), silicon germanium (SiGe), gallium arsenide (GaAs), germanium (Ge), silicon on insulator (SOI), or any other suitable materials.

Stack structure 304 may include a plurality of dielectric layers 308 and a plurality of sacrificial layers 306 stacked alternatingly along the vertical direction. Each sacrificial layer 306 and an underlying dielectric layer 308 may form a sacrificial/dielectric pair. In some embodiments, stack structure 304 is a staircase structure (not shown) that includes a plurality of stairs, in which each stair includes one or more sacrificial/dielectric pairs. In some embodiments, sacrificial layers 306 and dielectric layers 308 may include different materials and thus can be selectively etched, e.g., in the gate-replacement process.

Stack structure 304 can be formed by forming a material stack of a plurality of interleaved initial dielectric layers and initial sacrificial layers over substrate 302 and repetitively etching the material stack using an etch mask, e.g., a patterned PR layer over the material stack. Each initial sacrificial layer and the underlying initial dielectric layer may be referred to as an initial dielectric pair. In some embodiments, one or more initial dielectric pairs can form one level/stair. The initial sacrificial and dielectric layers may be formed by alternatingly depositing layers of a sacrificial material and layers of a dielectric material over substrate 302. In some embodiments, the initial sacrificial layers include silicon nitride and the initial dielectric layers include silicon oxide. The deposition of the initial sacrificial and dielectric layers may include atomic layer deposition (ALD), chemical vapor deposition (CVD), physical vapor deposition (PVD), or any combination thereof.

The patterned PR layer is trimmed (e.g., etched incrementally and inwardly from the boundary of the material stack, often from all directions) and used as the etch mask for etching the exposed portion of the material stack. The amount of trimmed PR can be directly related (e.g., determinant) to the dimensions of the stairs. The trimming of the PR layer can be obtained using a suitable etch, e.g., an isotropic etching process, such as wet etching. One or more PR layers can be formed and trimmed consecutively for the formation of stack structure 304. Each dielectric pair can be etched, after the trimming of the PR layer, using suitable etchants to remove a portion of both the initial sacrificial layer and the underlying initial dielectric layer. The etched initial sacrificial layers and initial dielectric layers may respectively form sacrificial layers 306 and dielectric layers 308, which form stairs in stack structure 304. The PR layer(s) can then be removed. The etching of the material stack and the etch masks may include an anisotropic etching process such as dry etch and/or an isotropic etching process such as wet etch.

Channel holes 310 may be formed by an anisotropic etching process such as dry etch and/or an isotropic etching process such as wet etch. In some embodiments, a deep reactive-ion etching (DRIE) is employed to form channel holes 310. In some embodiments, channel holes 310 each extends in stack structure 304 and exposes substrate 302. In some embodiments, channel holes 310 extend into substrate 302. Optionally, a semiconductor plug 322 may be formed at the lower portion of channel hole 310 by epitaxial growth and/or deposition. Semiconductor plug 322 may be in contact with substrate 302 in the lower portion of channel hole 310.

Referring back to FIG. 6, after the channel holes are formed, method 300 proceeds to operation 604, in which a functional layer is formed, the functional layer including a blocking layer, a memory layer, and a tunneling layer sequentially deposited over the sidewall of each channel hole. FIG. 3B illustrates a corresponding structure.

As shown in FIG. 3B, a blocking layer 312, a functional layer that includes a memory layer 314, and a tunneling layer 316 can be sequentially deposited over the sidewall of channel hole 310. In some embodiments, the deposition of blocking layer 312, memory layer 314, and tunneling layer 316 include thin film deposition processes such as ALD, CVD, PVD, or any combination thereof. In some embodiments, the deposition of blocking layer 312, memory layer 314, and/or tunneling layer 316 includes ALD. In some embodiments, blocking layer 312, memory layer 314, and tunneling layer 316 are arranged radially from the sidewall of channel hole 310 towards the center of channel hole 310. Tunneling layer 316 may be over memory layer 314 and may be exposed in channel hole 310.

Referring back to FIG. 6, after the deposition of the blocking layer, memory layer, and tunneling layer, method 300 proceeds to operation 606, in which a thermal treatment is performed. FIG. 3C illustrates a corresponding structure.

As shown in FIG. 3C, a thermal treatment may be performed. In some embodiments, the thermal treatment includes an annealing process. In some embodiments, the thermal treatment reduces the nitrogen weight percent in tunneling layer 316, forming an annealed tunneling layer 326 with reduced nitrogen weight percent. In some embodiments, the thermal treatment also causes the oxygen weight percent to increase in annealed tunneling layer 326. In some embodiments, the thermal treatment repairs the defects in tunneling layer 316 and improves the film quality of tunneling layer 316. For example, annealed tunneling layer 326 may have a denser film. In some embodiments, the reaction gases, e.g., oxygen gas and/or hydrogen chloride gas, repairs dangling bonds and defects in tunneling layer 316. In some embodiments, the thermal treatment improves electrical properties of the 3D memory device. For example, annealed tunneling layer 326 may improve data retention in the 3D memory device. In some embodiments, the nitrogen weight percent in annealed tunneling layer 326 is decreased, such as in a range of about 10% to about 28%. In some embodiments, the nitrogen weight percent is in a range of about 10% to about 20%. In some embodiments, the thermal treatment has little or no impact on the material composition of memory layer 314 and blocking layer 312.

The thermal treatment may take place in annealing apparatus 200. Referring back to FIG. 2, annealing apparatus 200 may include a furnace 202, a plurality of gas sources 204, a sample holder 208 that holds a plurality of samples 206, and a controller 214 that controls various operations and parameters of the thermal treatment. Furnace 202 may include a resistance heated furnace that provides a reactor chamber 220 in which the samples are annealed. The annealing condition in reactor chamber 220 can be controlled by controlling various parameters, e.g., an annealing time period, an annealing temperature, an annealing pressure, gas flow rates, or any other parameters associated with the thermal treatment. These parameters and operations may be controlled by controller 214, e.g., a computer and/or an operator. Gas sources 204 provide gases that create an annealing atmosphere. In some embodiments, gas sources 204 provide at least oxygen gas. In some embodiments, gas sources 204 provide at least nitrogen gas. In some embodiments, gas sources 204 provide at least hydrogen gas. In some embodiments, gas sources 204 provide a mixture of oxygen gas, hydrogen chloride gas, and/or nitrogen gas. In some embodiments, the gases, e.g., the oxygen gas, the hydrogen chloride gas, and the nitrogen gas, include any suitable gases that contain the respective element and are not limited to the single element. Gases in the gas sources 204 may be introduced into furnace 202 through an inlet 210 to mix and fill up reactor chamber 220. Controller 214 may control the flow rates of the oxygen gas and hydrogen chloride gas to obtain a desired annealing pressure and a desired ratio of the flow rates. In some embodiments, the sample holder 208 includes quartz. The gases are vented through an exhaust 212.

Samples 206, e.g., include a 3D memory device that has stack structure 304 and tunneling layer 316 formed in stack structure 304, can be placed on sample holder 208 in reactor chamber 220 for the thermal treatment. In various embodiments, samples 206 may be placed horizontally and/or vertically in reactor chamber 220. Various parameters may be adjusted to obtain the optimized result that can reduce the nitrogen weight percent in tunneling layer 104 and maximize the range of nitrogen weight percent in tunneling layer 104. The annealing temperature, e.g., controlled by controller 214, may be in a range of about 700 degrees Celsius to about 1000 degrees Celsius. In some embodiments, the annealing temperature is in a range of about 800 degrees Celsius to about 950 degrees Celsius. The annealing time period, e.g., controlled by controller 214, may be in a range of, e.g., about 20 minutes to about 150 minutes. In some embodiments, the annealing time period is in a range of about 30 minutes to about 120 minutes. In some embodiments, the annealing pressure, controlled by controller 214, is about standard atmospheric pressure. In various embodiments, the annealing parameters such as the annealing temperature, the annealing time period, and the annealing pressure are adjusted flexibly based on the desired nitrogen weight percent, and the values should not be limited by the embodiments of the present disclosure.

In some embodiments, oxygen gas is introduced into reactor chamber 220 through inlet 210 for the thermal treatment, by controller 214. In some embodiments, a mixture of oxygen and hydrogen chloride gas is introduced into reactor chamber 220 through inlet 210, by controller 214. In some embodiments, the thermal treatment using a mixture of hydrogen chloride gas and oxygen gas in the atmosphere can reduce a greater portion of nitrogen weight percent in tunneling layer 104 than using only oxygen. In some embodiments, in introducing the mixture, the flow rate of oxygen gas is higher than the flow rate of hydrogen chloride gas. In some embodiments, the flow rate of oxygen gas is in a range of about 5 liters to about 10 liters per minute, and the flow rate of hydrogen chloride gas is in a range of about 50 cubic centimeters (ccm) to about 150 ccm per minute. In some embodiments, when other annealing parameters (e.g., annealing pressures, annealing time periods, and gases and respective flow rates) are kept the same, a higher annealing temperature results in a lower nitrogen weight percent in the tunneling layer.

As examples, nitrogen weight percents and/or oxygen weight percents formed under different annealing conditions are illustrated in FIGS. 4 and 5. FIG. 4 illustrates a comparison of nitrogen weight percents in tunneling layers using different gases in the atmosphere in annealing processes, according to some embodiments. The horizontal axis represents a depth of a tunneling layer, and the vertical axis represents a number of nitrogen (N) atoms per cubic centimeter. FIG. 4 thus illustrates trends of nitrogen weight percents as a function of the depth of the tunneling layer and can be determined based on characterization results of secondary-ion mass spectrometry (SIMS). The depth of the tunneling layer (e.g., increasing from left to right in FIG. 4) represents the distance from the tunneling layer/semiconductor layer interface (or the exposed surface of the tunneling layer if the measurement of nitrogen weight percent is performed before the deposition of the semiconductor layer) towards the storage layer along the x-axis. For example, as shown in FIGS. 3B and 3C, the depth represents the distance, e.g., along the x-axis, from the exposed surface of tunneling layer 316/326 to a measuring point in tunneling layer 316/326. The measuring point may be any location in tunneling layer 316/326 until the tunneling layer/storage layer interface. After semiconductor layer 318 is deposited, as shown in FIG. 3D, the depth starts from the tunneling layer/semiconductor layer interface instead of the exposed surface of tunneling layer 316/326. The depth is less than or equal to the thickness of the tunneling layer, which is in a range of about 5 nm to about 20 nm. In FIG. 4, in a tunneling layer, (i) "As Dep" represents the nitrogen weight percent without any annealing process; (ii) "Post N2 ANN" represents the nitrogen weight percent using N2; (iii) "Post N2O ANN" represents the nitrogen weight percent using $N_2O$; (iv) "Post O2 ANN" represents the nitrogen weight percent using only $O_2$; and (v) "Post HCL+O2 ANN" represents the nitrogen weight percent using a mixture of $O_2$ and hydrogen chloride gas. In annealing processes (i)-(v), other annealing parameters, e.g., annealing temperature, annealing pressure, and annealing time period, may be the same. As shown in FIG. 4, annealing process (ii), which is the annealing process using only N2 (e.g., without any oxygen gas), has the highest nitrogen weight percent, compared to other annealing process using $O_2$ or oxygen-containing gases. Using $N_2O$ as for the annealing process results in lower nitrogen weight percent than using only $O_2$ in the annealing process. Using a mixture of $O_2$ and hydrogen chloride gas in the annealing process can achieve the lowest nitrogen weight percent.

FIG. 5 illustrates the oxygen and nitrogen weight percents under different annealing time periods, according to some embodiments. The horizontal axis represents the depth of a tunneling layer, and the vertical axis represents percentages of nitrogen (N) and oxygen (O). The explanation of the depth of the tunneling layer can be similar to or the same as that of FIG. 4 and is not repeated herein. FIG. 5 thus illustrates trends of nitrogen weight percents and oxygen weight percents as a function of the depth of the tunneling layer and can be determined based on characterization results of x-ray photoelectron spectroscopy (XPS). In FIG. 5, in a tunneling layer, (i) "80 min ANL N" represents the nitrogen weight percent under an annealing time period of 80 minutes; (ii) "50 min ANL N" represents the nitrogen weight percent under an annealing time period of 50 minutes; (iii) "Skip ANL N" represents the nitrogen weight percent without any annealing process; (iv) "80 min ANL O" represents the oxygen weight percent under an annealing time period of 80 minutes; (ii) "50 min ANL O" represents the oxygen weight percent under an annealing time period of 50 minutes; (iii) "Skip ANL O" represents the oxygen weight percent without any annealing process. In annealing processes (i)-(vi), annealing parameters such as annealing temperature, annealing pressure, and gases may be the same. In some embodiments, a mixture of oxygen gas and hydrogen chloride gas is used to fill up reactor chamber 220 for annealing processes (i)-(vi). As shown in FIG. 5, a longer annealing time period may result in a lower nitrogen weight percent and a higher oxygen weight percent. The tunneling layer without any annealing process may have the highest nitrogen weight percent and lowest oxygen weight percent. In some embodiments, the change of nitrogen weight percent may gradually decrease as the annealing process goes on.

In one example, the annealing temperature is about 800 degrees Celsius to about 900 degrees Celsius, the annealing time period is about 30 minutes, the annealing pressure is about standard atmospheric pressure, and oxygen gas and a mixture of oxygen gas and hydrogen chloride gas are respectively introduced into reactor chamber 220 for annealing processes. The nitrogen weight percent resulted from the annealing process using only oxygen gas is about 22%, and the nitrogen weight percent resulted from the annealing process using oxygen gas and hydrogen chloride gas is about 15%. In another example, as the annealing time period increases to about 80 minutes, the nitrogen weight percents decrease respectively to about 15% (with only oxygen gas) and 10% (with the mixture).

In some embodiments, a recess etching process is performed before or after the annealing process to remove a respective portion of tunneling layer 316 (or annealed tunneling layer 326), memory layer 314, and blocking layer 312 at the lower portion of channel hole 310 to expose semiconductor plug 322 (or substrate 302 if no semiconductor plug 322 is formed). The recess etching process may include a suitable etching process such as dry etch and/or wet etch.

Referring back to FIG. 6, after the annealing process, method 300 proceeds to operation 608, in which a semiconductor layer and a dielectric core are subsequently deposited in the channel hole to completely or partially fill up the channel hole. FIG. 3D illustrates a corresponding structure.

As shown in FIG. 3D, a semiconductor layer 318 may be deposited over annealed tunneling layer 325. Semiconductor layer 318 may be in contact with substrate 302 (if no semiconductor plug 322 is formed) or in contact of semiconductor plug 322. A semiconductor channel may be formed in semiconductor layer 318 and may be conductively connected to substrate 302. In some embodiments, a dielectric core 320 is deposited over semiconductor layer 318 to completely or partially fill up the remaining space in channel hole 310. The deposition of semiconductor layer 318 and dielectric core 320 may include thin film deposition processes such as ALD, CVD, PVD, or any combination thereof. A channel structure with blocking layer 312, memory layer 314, annealed tunneling layer 326, semiconductor layer 318, and dielectric core 320 may be formed.

In some embodiments, a recess etch, e.g., dry etch and/or wet etch, is performed to remove a top portion of the channel structure, and another plug is formed in the recess region.

The other plug may be formed by deposition of a semiconductor material using one or more of ALD, CVD, PVD, or any combination thereof. The other plug may function as an etch stop layer for the layers in the channel structure in subsequent fabrication operations and may also function as the drain of the respective 3D NAND memory string. In some embodiments, a gate-replacement process is performed to replace sacrificial layers 306 with a plurality of conductor layers, which function as the gate electrodes of the 3D NAND memory strings. Sacrificial layers 306 may be removed by an isotropic etching process, e.g., wet etch, to form a plurality of lateral recesses in stack structure 304. A conductor material, e.g., W, Co, Al, Cu, silicides, and/or doped polysilicon, can be deposited to fill in the lateral recesses, forming the conductor layers. The deposition of the conductor material may include ALD, CVD, PVD, electroplating, or any combination thereof. A plurality of memory cells may be formed by the gate electrodes and the 3D NAND memory strings, and stack structure 304 may thus be referred to as a memory stack.

Figure 7A:
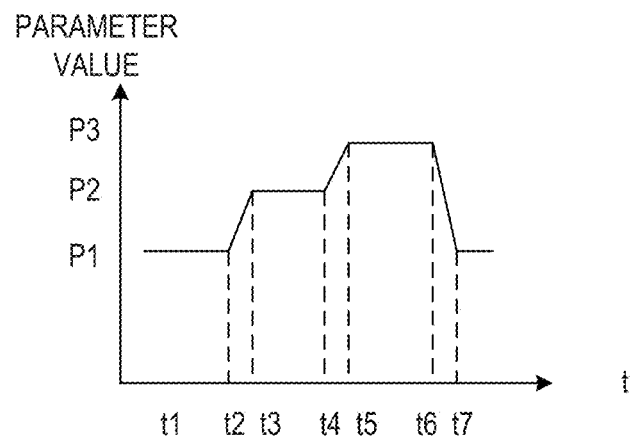
FIGS. 7A-7C illustrate exemplary parameter adjustment during annealing processes, according to some embodiments.
Figure 7B:
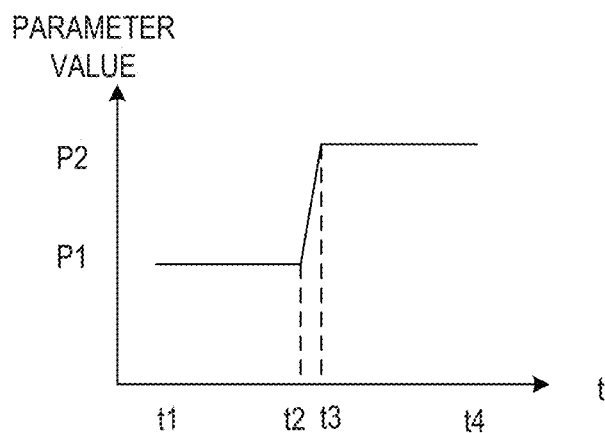
Figure 7C:
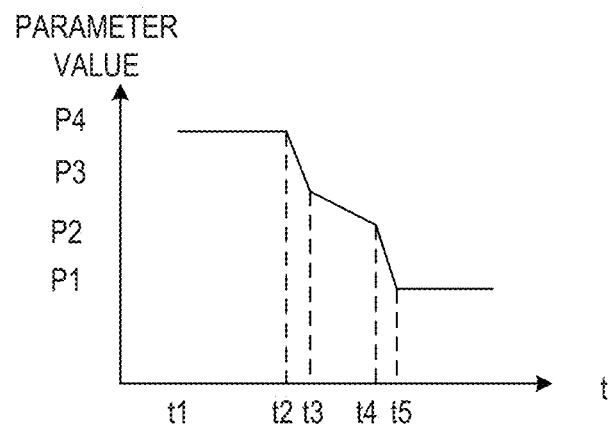

FIGS. 7A-7C each illustrates an example of a parameter value being adjusted as a function of time during a thermal treatment, e.g., an annealing process, according to some embodiments. The parameter can be adjusted in different, e.g., consecutive, time periods. In some embodiments, in each time period, the parameter varies as a linear function of time or maintains a constant value. The parameter may represent any suitable condition/variable that can be controlled/adjusted during the annealing process. For example, the parameter may include a treatment pressure (e.g., an annealing pressure), a treatment temperature (e.g., an annealing temperature), and/or a flow rate of a gas. These different conditions/variables can be adjusted separately or simultaneously to respective desired values. It should be understood that, for ease of illustration, denotations "t1," "t2," "t3," . . . , may represent the same time or different times in the respective figure, and "P1," "P2," . . . , may represent the same value or different values in the respective figure. In some embodiments, the times, e.g., t1, t2, t3, are each less than the maximum treatment time of the thermal treatment, and the parameter values, e.g., P1, P2, . . . , are each less than the maximum parameter value of the thermal treatment. It should also be understood that, FIGS. 7A-7C merely represent different exemplary trends in the adjustment of parameters, and should not limit the actual parameter values and times corresponding to each parameter in the thermal treatment. For example, treatment pressure and treatment temperature can be adjusted separately or simultaneously, and can follow the same trend or different trends. The variation from one parameter value to another parameter value and/or of a single parameter value may be linear, exponential, and/or parabolic.

As an example, in FIG. 7A, the parameter value may be P1 in time period (t1, t2), increase from P1 to P2 in time period (t2, t3), maintain P2 in time period (t3, t4), increase from P2 to P3 in time period (t4, t5), maintain P3 in time period (P5, P6), decrease from P3 to P1 in time period (t6, t7), and maintain P1 from t7. In another example, in FIG. 7B, the parameter value may be P1 in time period (t1, t2), increase from P1 to P2 in time period (t2, t3), and maintain P2 in time period (t3, t4). In some embodiments, in FIG. 7B, P represents annealing temperature. In some embodiments, P1 represents about 800 degrees Celsius to about 850 degrees Celsius, P2 represents about 850 degrees Celsius to about 900 degrees Celsius, time period (t1, t2) represents about 30 minutes, time period (t2, t3) represents about 5 minutes, and time period (t3, t4) represents about 30 minutes. As a further example, in FIG. 7C, the parameter value may maintain P4 in time period (t1, t2), decrease from P4 to P3 in time period (t2, t3), decrease from P3 to P2 in time period (t3, t4), decrease from P2 to P1 in time period (t4, t5), and maintain P1 from t5. In various embodiments, the actual values of parameter value and the variation of parameter value as a function of time should be subjected to the annealing condition and controlled flexibly based on the desired material properties, e.g., the nitrogen weight percent, of the tunneling layer, and should not be limited by the embodiments of the present disclosure.

According to embodiments of the present disclosure, a memory device includes a substrate, a memory stack, and a channel structure. The memory stack includes interleaved conductor layers and dielectric layers over the substrate. The channel structure extends through the memory stack into the substrate and includes a functional layer that has a tunneling layer of which a nitrogen weight percent is not greater than about 28%.

In some embodiments, the functional layer further includes a blocking layer and a memory layer. The blocking layer, the memory layer, and the tunneling layer are arranged radially from a sidewall to a center of the channel structure.

In some embodiments, the nitrogen weight percent is in a range of about 10% to about 28%.

In some embodiments, an oxygen weight percent in the tunneling layer is in a range of about 32% to about 46%.

In some embodiments, the channel structure further includes a semiconductor layer over the tunneling layer and a dielectric core over the semiconductor layer and filling up the channel structure.

In some embodiments, the tunneling layer includes silicon oxynitride.

In some embodiments, the tunneling layer includes a composite structure that includes a plurality of silicon oxynitride layers.

In some embodiments, the memory device further includes a semiconductor plug in contact with the substrate and the channel structure.

In some embodiments, the nitrogen weight percent is no greater than about 20%.

According to the embodiments of the present disclosure, a method for forming a memory device includes the following operations. First, a channel hole is formed in a stack structure over a substrate. A blocking layer, a memory layer, and a tunneling layer are sequentially deposited to arrange radially from a sidewall of the channel hole towards a center of the channel hole. A thermal treatment is performed to adjust a nitrogen weight content in the tunneling layer to be no greater than about 28%. A semiconductor layer is deposited over the tunneling layer in the channel hole.

In some embodiments, the thermal treatment reduces the nitrogen weight content in the tunneling layer.

In some embodiments, performing the thermal treatment includes performing an annealing process.

In some embodiments, performing the annealing process includes providing an annealing atmosphere filled with oxygen gas.

In some embodiments, performing the annealing process includes providing the annealing atmosphere filled with a mixture of oxygen gas and hydrogen chloride gas.

In some embodiments, a flow rate of oxygen gas is higher than a flow rate of hydrogen chloride gas.

In some embodiments, providing the annealing process further includes providing at least one of an annealing time period, an annealing temperature, or an annealing pressure.

In some embodiments, the annealing time period is in a range of about 20 minutes to about 150 minutes. In some embodiments, the annealing temperature is in a range of about 700 degrees Celsius to about 1000 degrees Celsius. In some embodiments, the annealing pressure is about standard atmospheric pressure.

In some embodiments, the thermal treatment reduces a number of defects in the tunneling layer.

In some embodiments, performing the thermal treatment includes adjusting a parameter value of the thermal treatment in consecutive time periods. The parameter value includes at least one of a treatment pressure, a treatment temperature, or a flow rate of a gas.

In some embodiments, depositing the blocking layer, the memory layer, and the tunneling layer each comprise ALD.

In some embodiments, the annealing process is performed before the deposition of the semiconductor layer.

In some embodiments, the method further includes depositing a dielectric core over the semiconductor layer to at least partially fill up the channel hole.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
 a substrate;
 a memory stack comprising interleaved conductor layers and dielectric layers over the substrate; and
 a channel structure extending through the memory stack into the substrate, wherein the channel structure comprises a functional layer that comprises a tunneling layer, the tunneling layer comprising a plurality of silicon oxynitride layers and a silicon oxide layer such that a nitrogen weight percent of the plurality of silicon oxynitride layers and the silicon oxide layer is not greater than about 28%.

2. The memory device of claim 1, wherein the functional layer further comprises a blocking layer and a memory layer, the blocking layer, the memory layer, and the tunneling layer arranged radially from a sidewall to a center of the channel structure.

3. The memory device of claim 1, wherein the nitrogen weight percent is in a range of about 10% to about 28%.

4. The memory device of claim 1, wherein an oxygen weight percent in the tunneling layer is in a range of about 32% to about 46%, and the oxygen weight percent is higher than the nitrogen weight percent.

5. The memory device of claim 1, wherein the channel structure further comprises:
   a semiconductor layer over the tunneling layer; and
   a dielectric core over the semiconductor layer and filling up the channel structure.

6. The memory device of claim 1, wherein the tunneling layer comprises silicon oxynitride.

7. The memory device of claim 1, wherein the tunneling layer comprises a composite structure that comprises a plurality of silicon oxynitride layers.

8. The memory device of claim 1, further comprising a semiconductor plug in contact with the substrate and the channel structure.

9. The memory device of claim 1, wherein the nitrogen weight percent is no greater than about 20%.

10. A method for forming a memory device, comprising:
    forming a channel hole in a stack structure over a substrate;
    depositing, sequentially, a blocking layer and a memory layer radially from a sidewall of the channel hole towards a center of the channel hole;
    after the deposition of the blocking layer and the memory layer, depositing a tunneling layer in direct contact with the memory layer;
    performing a thermal treatment to adjust a nitrogen weight content in the tunneling layer to be no greater than about 28%; and
    depositing a semiconductor layer in direct contact with the tunneling layer in the channel hole after the thermal treatment.

11. The method of claim 10, wherein the thermal treatment reduces the nitrogen weight content in the tunneling layer.

12. The method of claim 10, wherein performing the thermal treatment comprises performing an annealing process.

13. The method of claim 12, wherein performing the annealing process comprises providing an annealing atmosphere filled with oxygen gas.

14. The method of claim 13, wherein performing the annealing process comprises providing the annealing atmosphere filled with a mixture of oxygen gas and hydrogen chloride gas.

15. The method of claim 14, wherein a flow rate of oxygen gas is higher than a flow rate of hydrogen chloride gas.

16. The method of claim 12, wherein providing the annealing process further comprises providing at least one of an annealing time period, an annealing temperature, or an annealing pressure, and wherein
    the annealing time period is in a range of about 20 minutes to about 150 minutes;
    the annealing temperature is in a range of about 700 degrees Celsius to about 1000 degrees Celsius; and
    the annealing pressure is about standard atmospheric pressure.

17. The method of claim 11, wherein the thermal treatment reduces a number of defects in the tunneling layer.

18. The method of claim 10, wherein performing the thermal treatment comprises adjusting a parameter value of the thermal treatment in consecutive time periods, the parameter value comprising at least one of a treatment pressure, a treatment temperature, or a flow rate of a gas.

19. The method of claim 10, wherein depositing the blocking layer, the memory layer, and the tunneling layer each comprise atomic layer deposition (ALD).

20. The method of claim 10, wherein the semiconductor layer is deposited after thermal treatment without intermediate steps.

* * * * *